US010840171B2

(12) United States Patent
Meyers et al.

(10) Patent No.: US 10,840,171 B2
(45) Date of Patent: Nov. 17, 2020

(54) INTEGRATED CIRCUIT PACKAGE INCLUDING INWARD BENT LEADS

(71) Applicant: Texas Instruments Incorporated, Dallas, TX (US)

(72) Inventors: Michael L. Meyers, Dallas, TX (US); Scott F. Eisenhart, Allen, TX (US); Richard J. Saye, Greenville, TX (US); Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/202,808

(22) Filed: Nov. 28, 2018

(65) Prior Publication Data
US 2020/0168531 A1 May 28, 2020

(51) Int. Cl.
*H01L 23/495* (2006.01)
*H01L 23/00* (2006.01)

(52) U.S. Cl.
CPC .. *H01L 23/49551* (2013.01); *H01L 23/49503* (2013.01); *H01L 24/49* (2013.01); *H01L 2224/48091* (2013.01); *H01L 2224/48247* (2013.01)

(58) Field of Classification Search
CPC ......... H01L 51/56; H01L 43/02; H01L 43/10; H01L 43/12; H01L 51/0097
USPC ....................................................... 257/666
See application file for complete search history.

(56) References Cited

U.S. PATENT DOCUMENTS

| 5,783,861 | A | 7/1998 | Son |
| 2003/0062601 | A1* | 4/2003 | Harnden ............. H01L 23/3107 257/666 |
| 2007/0007640 | A1 | 1/2007 | Harnden et al. |
| 2011/0291254 | A1 | 12/2011 | Harnden et al. |
| 2015/0214136 | A1 | 7/2015 | Lee et al. |
| 2019/0139869 | A1* | 5/2019 | Danny Koh ...... H01L 23/49575 |

FOREIGN PATENT DOCUMENTS

| JP | H0451552 A | 2/1992 |
| WO | 2018126153 | 7/2018 |

* cited by examiner

*Primary Examiner* — Andy Huynh
(74) *Attorney, Agent, or Firm* — Ronald O. Neerings; Charles A. Brill; Frank D. Cimino (57) ABSTRACT

A packaged semiconductor device includes a semiconductor die mounted on a leadframe, a housing for the semiconductor die defining a horizontal plane and a horizontal direction. The leadframe includes leads each having an inner lead portion inside the housing and an outer lead portion that includes a first portion that extends out in the horizontal direction from one of the sidewalls of the housing, a transition portion that includes a vertical direction component, and a distal end portion, wherein the distal end portion of the leads are all on the horizontal plane. The outer lead portions alternate between a gull wing lead shape having the distal end portions extending in the horizontal direction outward from the housing and inward extending leads that have their distal end portions extending in the horizontal direction inward toward the housing. The leadframe consists of a single leadframe.

20 Claims, 7 Drawing Sheets

INTEGRATED CIRCUIT PACKAGE INCLUDING INWARD BENT LEADS

FIELD

This Disclosure relates to lead arrangements for integrated circuit (IC) packages.

BACKGROUND

A variety of semiconductor IC packages are known that provide support for at least one IC die, provide protection from the environment, and enable surface mounting of the IC die to and interconnection with a printed circuit board (PCB). One conventional package configuration comprises a leadframe having a die pad and a plurality of leads around the die pad. For plastic packaging, after IC die-bonding top side up, wire-bonding generally follows, or after flipchip mounting the die top side down, then a molding process is carried out by utilizing the lead frame to form a molded housing, so that a semiconductor package can be obtained by cutting and trimming the leads protruded to an exterior of the housing.

Gull wing leads extend out of the housing essentially horizontally from the sidewall surface of the package material, then down along a diagonal path with horizontal and vertical components, and then out again out in the horizontal direction to provide a distal end portion suitable for soldering to a PCB. Gull-wing leads are commonly used on surface mount chips such as quad flat packs (QFPs) and small outline integrated circuits (SOICs). Gull wing packages compared to flat lead packages are known to provide superior self-alignment performance based on the surface tension of molten solder during package mounting on the customer's PCB, even with some displacement.

Small Outline Gull Wing IC packages are known to be limited in functional density (i.e., their pin count) by standardized PCB land pattern spacing requirements. There is an increasing need to allow more pins (or leads) in a given board area without increasing PCB manufacturing complexity (pin to pin or lead to lead spacing), and the package overall size. Package types affected include SOIC, Small-outline package (SOP), Micro Small Outline Package (MSOP), Shrink small-outline package (SSOP), Thin small-outline package TSOP), Thin shrink small-outline package (TSSOP), Small-outline transistor (SOT), and thin small-outline transistor (TSOT). A conventional SOP gull wing package has a pin pitch of 0.4 mm (TSSOP) to 0.95 mm (SOT), and a pin width 0.2 mm to 0.5 mm. The extended lead portion of all leads coming out of all such packages are in the same gull wing shape.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a leadframe design that has gull wing leads alternating with inward bent leads that have their distal flat (horizontal) end portion bent inward towards the housing of the package. Having alternating leads bent with their distal end portion being bent towards the housing instead of conventionally all outwards as with gull wing leads is recognized to allow one to increase the lead (or pin) density while maintaining the same lead width and a reasonable lead pitch. The inward bent leads can optionally extend under the package housing.

A packaged semiconductor device includes a semiconductor die mounted on a leadframe, a housing for the semiconductor die defining a horizontal plane and a horizontal direction. The leadframe includes leads each having an inner lead portion inside the housing and an outer lead portion that includes a first portion that extends out in the horizontal direction from one of the sidewalls of the housing, a transition portion that includes a vertical direction component, and a distal end portion, wherein the distal end portion of the leads are all on the horizontal plane. The outer lead portions alternate between a gull wing lead shape having the distal end portions extending in the horizontal direction outward from the housing and inward extending leads that have their distal end portions extending in the horizontal direction inward toward the housing. The leadframe consists of a single leadframe.

BRIEF DESCRIPTION OF THE DRAWINGS

Reference will now be made to the accompanying drawings, which are not necessarily drawn to scale, wherein:

FIG. 6A shows a footprint for land pads of a PCB with in-line land pads with some example spacing distances shown for mounting leads of a conventional 8-pin TSSOP package, while

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1:
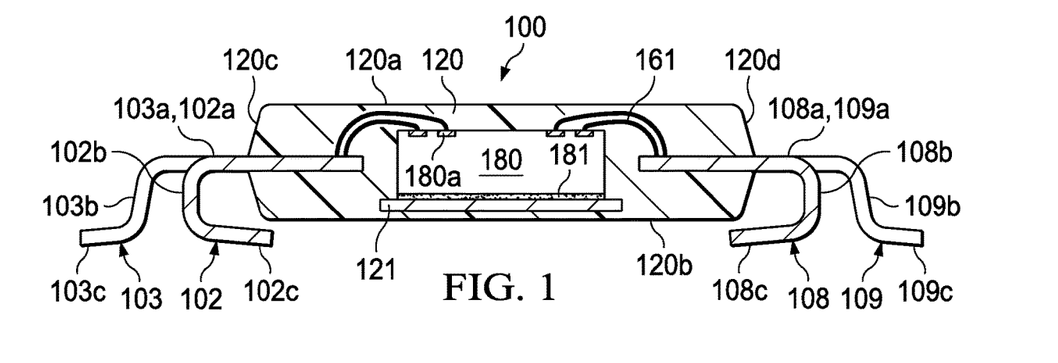
FIG. 1 is a cross sectional depiction of an example packaged semiconductor device has that has gull wing leads alternating with inward bent leads that have their distal ends bent inward towards the housing of the package, where the bond pads on the IC are wirebonded to the leads.
Figure 4:
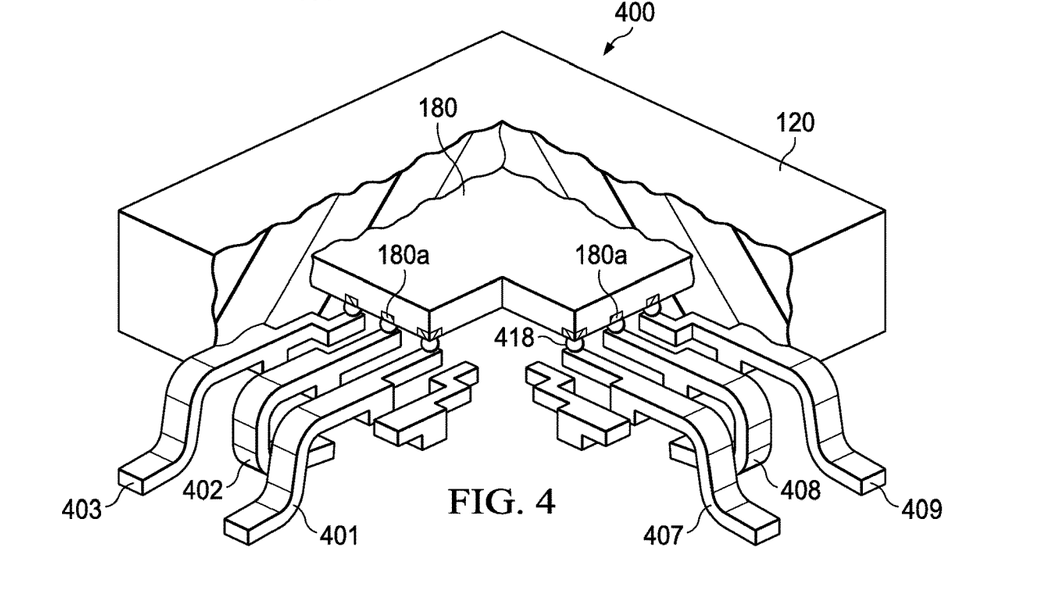
FIG. 4 is a partially revealed top perspective view of an example packaged semiconductor device to show the solder features shown as a flipchip on lead (FCOL) bonding arrangement with solder features on bond pads of the semiconductor die contacting the respective includes gull wing leads alternating with inward bent leads.

FIG. 1 is a cross sectional depiction of an example packaged semiconductor device 100 has that has gull wing leads shown as 103 and 109 alternating with inward bent leads 102 and 108 that have their distal end portions 102c, 108c bent inward towards the housing 120 of the package shown as a molded housing, where the bond pads 180a on the semiconductor die 180 are wirebonded by bond wires 161 to the respective leads. The leads are also all on the same horizontal plane inside the housing 120 because they are formed from the same metal sheet. FIG. 4 described below shows an alternative FCOL bonding arrangement.

The semiconductor die 180 is shown with its bottom side attached by a die attach material 181 (e.g. an epoxy) to a die pad 121. The semiconductor die 180 can be an IC or a discrete device die such as power transistor. The semiconductor die 180 can be multiple dies (stacked or lateral), and can include sensors or passive components (e.g., non-semiconductor, such as capacitors, resistors, inductors). Although the housing 120 is shown as a molded housing in FIG. 1, more generally the housing 120 can also comprise a ceramic housing. The housing 120 has a top surface 120a and a bottom surface 120b each defining a horizontal plane and horizontal in-plane directions, and includes a first sidewall 120c and at least a second sidewall 120d opposite the first sidewall between the bottom surface 120b and the top surface 120a.

The outer lead portions alternate between a gull wing lead shape (leads 103 and 109 described as odd numbered leads) having their distal end portions 103c and 109c extending in the horizontal direction outward from the housing 120 and the inward bent leads (102 and 108 described as even numbered leads) that have their distal end portions 102c and 108c extending in the horizontal direction inward toward the housing material 120. Alternatively, because the terms 'even' and 'odd' as used herein are interchangeable as long as the leads are alternating bent inwards and bent outwards, the gull wing shaped leads can be the even numbered leads and the inward bent leads can be the odd numbered leads.

The inward bent leads 102, 108 can be seen to be C-shaped or J-shaped. The distal end portions 102c, 108c of the inward bent leads 102, 108 are shown optionally extending under the housing 120. The leadframe consists of a single leadframe. Disclosed leadframes are a single leadframe meaning they are a single (or unitary) piece of the same material (e.g., copper) throughout without any joints, adhesives or bonding materials that join together otherwise separate leadframe pieces, so that disclosed leadframes are clearly different from a bonded leadframe arrangement with two stacked leadframes adhered to one another by an adhesive material.

The leads each have an inner lead portion inside the housing 120 and an outer lead portion that includes a first portion 102a, 103a, 108a, 109a that extends out in the horizontal direction from one of the first sidewall 120c and the second sidewall 120d, a transition portion 102b, 103b, 108b and 109b that includes a vertical direction component, and a distal end portion 102c, 103c 108c, and 109c. The distal end portion 102c, 103c 108c, and 109c are all on the same horizontal plane defined by the top surface 120a and the bottom surface 120b of the housing 120. As used herein, being on the same horizontal plane means essentially the same height in the z-(height) direction, that is normal to the horizontal direction, defined herein as all being no more than ±0.1 mm (about 4 mils) of a mean height from a reference plane. For example, the top surface of the distal end portion 102c, 103c 108c, and 109c having a minimum distance of zero (touching the bottom of the housing 120 for a non-exposed die pad) to a maximum distance away of ¾ of the leadframe materials' thickness that is generally from 4 mils to 8 mils, which is thus calculated as being at most 3 mils (0.076 mm) to 6 mils (0.152 mm) away from the bottom surface 120b of the housing 120.

In the case of an exposed die pad on the bottom of the package, the inward bent leads will not extend under the die pad, and the bottom surface 120b of the die pad and the bottom of the distal end of the inward bent leads vertical offset distance should be close to zero on the seating plane defined herein as being within 1 mil (0.025 mm). This close to zero vertical offset between the bottom of the die pad and the inward bent leads for a bottom exposed die pad configuration is to ensure a reliable solder interconnect can be made between both the inward bent leads and exposed die pad to respective land pads on a PCB.

Using only one leadframe for the entire packaged device 100 enables all the leads to be manufactured with one standard thickness leadframe that are on the same horizontal plane inside the housing (due to being formed from the same metal sheet) that horizontally come out of the housing 120 of the package on the essentially same plane (height) and remain on the same plane to the end of their distal end portion 102c, 103c 108c, and 109c. This aspects simplifies the package design and lowers the assembly cost by enabling applying solder (typically the distal end portion 102c, 103c 108c, and 109c being soldered to a PCB) at the same height.

Figure 2A:
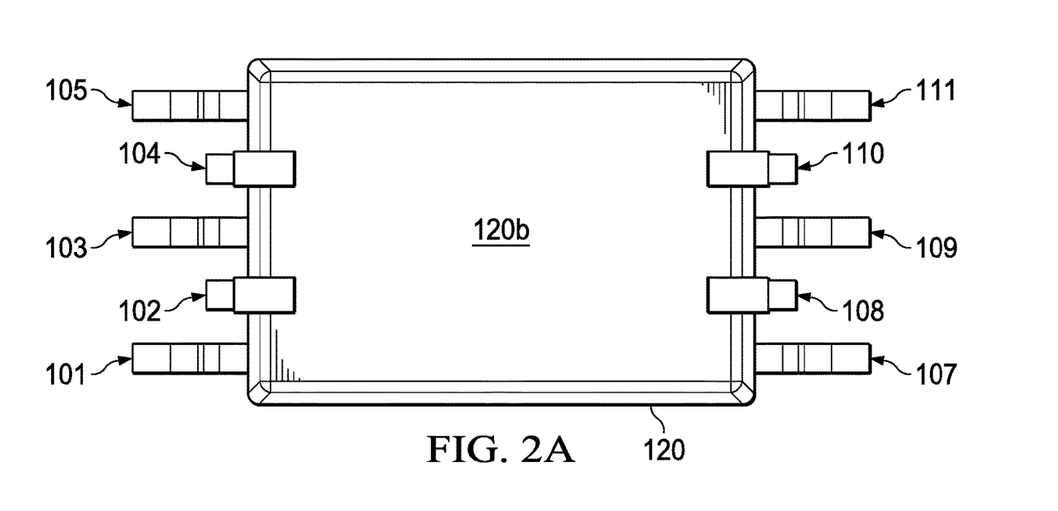
FIG. 2A is a bottom view of the packaged semiconductor device shown in FIG. 1 that has the distal ends of the inward bent leads again optionally extending under the housing.
Figure 2B:
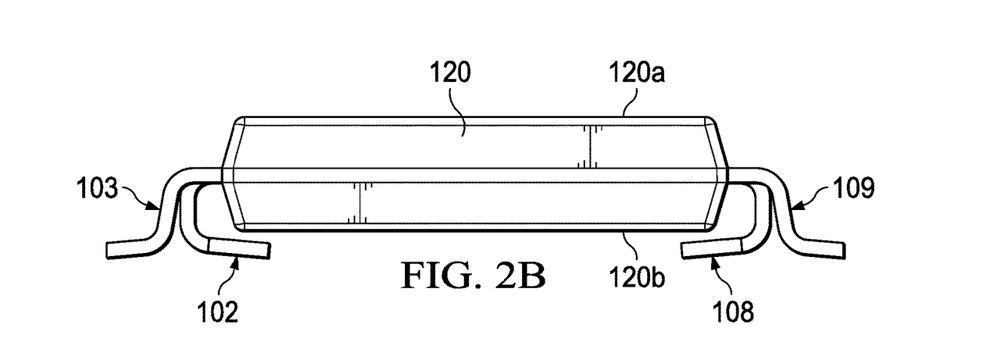
FIG. 2B is a side view of the packaged semiconductor device shown in FIG. 1.
Figure 2C:
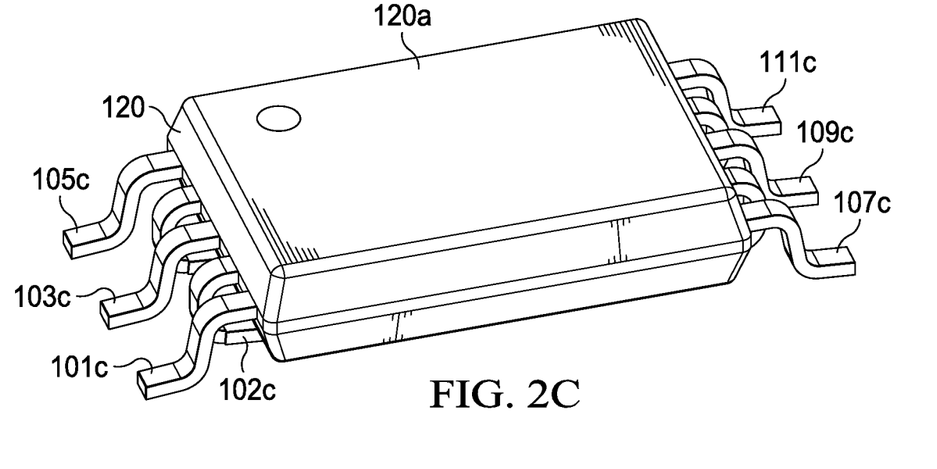
FIG. 2C is a top perspective view of the example packaged semiconductor device shown in FIG. 1A.
Figure 2D:
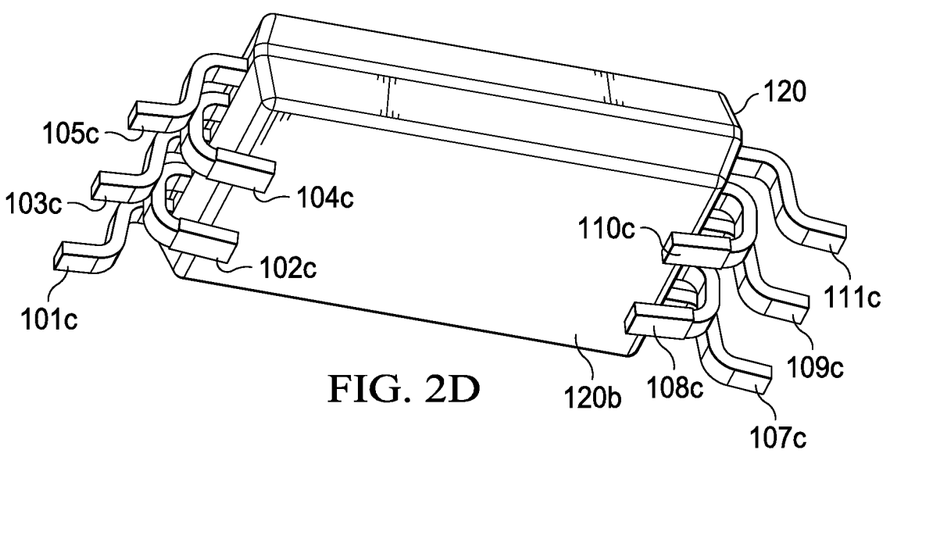
FIG. 2D is a bottom perspective view of the example packaged semiconductor device shown in FIG. 1.

FIG. 2A is a bottom view of the packaged semiconductor device 100 shown in FIG. 1 that has the distal end portions 102c, 103c, 108c, and 109c of the inward bent leads 102, 104, 108 and 110 again optionally extending under the bottom surface 120h of the housing 120. The gull wing leads are shown as 101, 103, 105, 107, 109 and 111. FIG. 2B is a side view of the packaged semiconductor device 100 shown in FIG. 1. FIG. 2C is a top perspective view the example packaged semiconductor device 100 shown in FIG. 1 showing the distal end portions 101c, 102c, 103c, 105c, 107c, 109c and 111c. FIG. 2D is a bottom perspective view of the example packaged semiconductor device 100 shown in FIG. 1 showing the distal end portions 101c, 102c, 103c, 104c, 105c, 106, 107c, 108c, 109c, 110c and 111c.

Figure 3A:
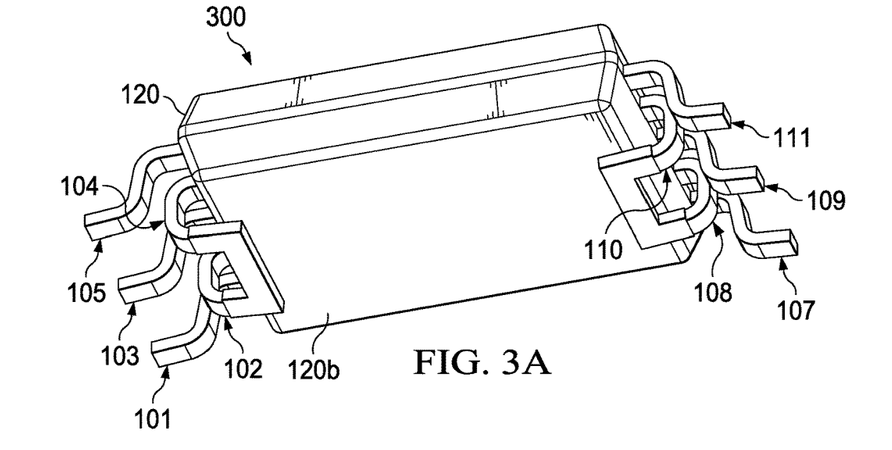
FIG. 3A is a bottom perspective view of a packaged device that has its inward bent even number leads bent under the housing and connected together on each side for providing better thermal performance, according to an example aspect.
Figure 3B:
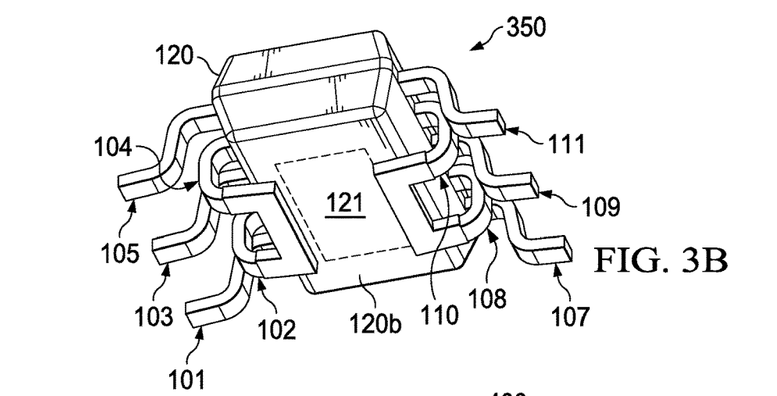
FIG. 3B is a bottom perspective view of a packaged device that has its inward bent even number leads bent under the die pad for providing better thermal performance, according to an example aspect.

FIG. 3A is a bottom perspective view of a packaged device 300 that has its inward bent even number leads 102 and 104 and 108 and 110 bent under the housing 120 and connected together on each side for providing better thermal performance, according to an example aspect. FIG. 3B is a bottom perspective view of a packaged device 350 that has its inward bent even number leads 102 and 104 and 108 and 110 bent under the die pad 121 for providing better thermal performance, according to an example aspect. Also, there can there be lead bending to have the inward bent leads contact the die pad before molding by utilizing a conventional tie bar or by adding a metal connector after lead bending before the molding.

FIG. 4 is a partially revealed top perspective view of an example packaged semiconductor device 400 to show the solder features 418 shown as a FCOL bonding arrangement with solder features 418 on bond pads of the semiconductor die 180 contacting the respective leads shown as leads 401, 402, 403, 407, 408 and 409. The solder features can comprise solder balls or solder capped (e.g., copper) pillars. The inward bent leads are shown as 402 and 408 and the gull wing leads are shown as 401, 403, 407, and 409.

FIGS. 5A-5D shows steps in an example method for forming a disclosed packaged semiconductor device having a leadframe that includes gull wing leads alternating with inward bent leads. There will generally be only limited needed changes to the packaged device assembly process. Disclosed methods can generally re-use all of the same steps in the current package device assembly process, with one additional step during the forming being the bending of the even number leads inwards as described below in FIG. 4C. The lead bending can start with a conventional arrangement comprising a leadframe sheet with a plurality of leadframes each with a plurality of linear leads extending out from the sidewall of the package material shown as a molded housing of an IC package on at least 2 sides of the IC package.

Figure 5A:
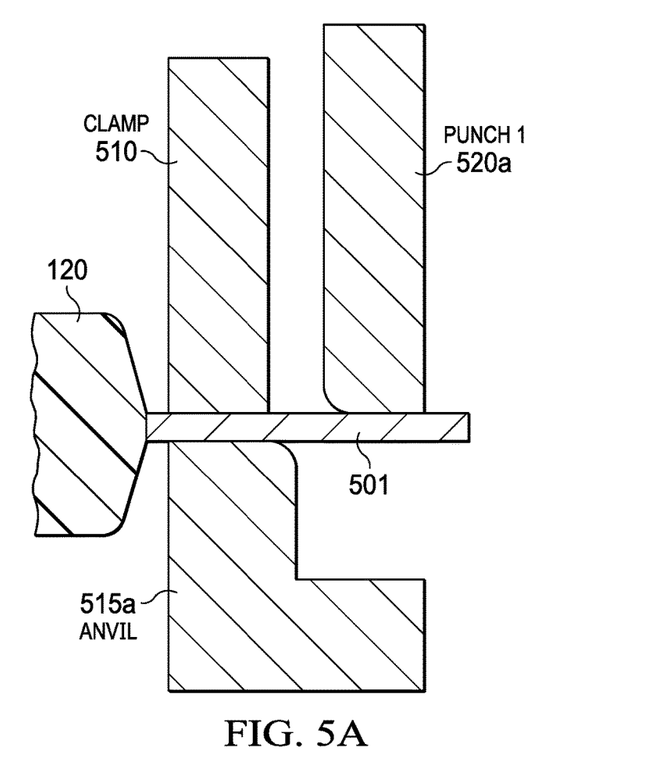
FIGS. 5A-5D shows steps in an example method for forming a disclosed packaged semiconductor device having a leadframe that includes gull wing leads alternating with inward bent leads.
Figure 5B:
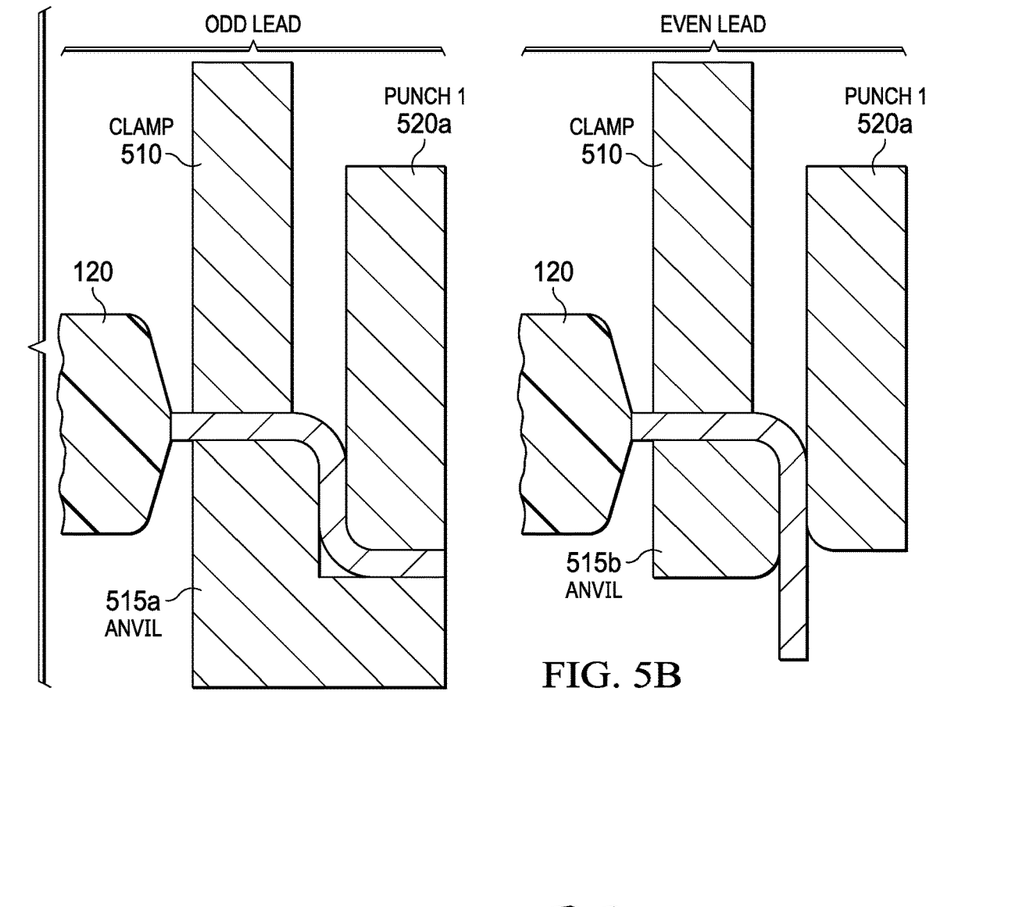
Figure 5C:
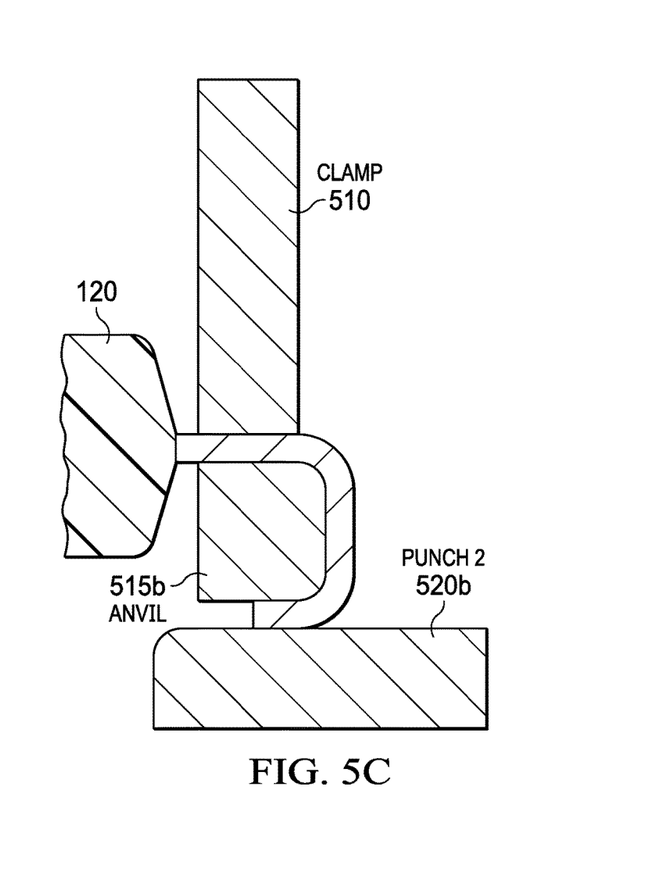

FIG. 5A shows an example lead bending apparatus before lead bending including a clamp 510 that can be a standard clamp, a disclosed anvil 515 (shown in FIG. 5D) including anvil portions 515a and 515b (see anvil portion 515b in FIG. 5B), and a disclosed punch including punch 1 520a and punch 2 520b (see punch 2 520b in FIG. 5C). FIG. 5B shows the clamp 510, anvil 515 and punch 1 520a of the pin bending apparatus shown configured for a first bending step for bending with the exterior lead portion of an odd lead intended to be bent to be a gull wing lead and an even lead intended to be inward bent lead. The anvil 515 is shown modified between contacting the alternating odd pins shown as anvil portion 515a and even pins shown as anvil portion 515b, and the direction of punch 1 520a is moved as shown both being downward in the vertical direction.

Figure 5D:
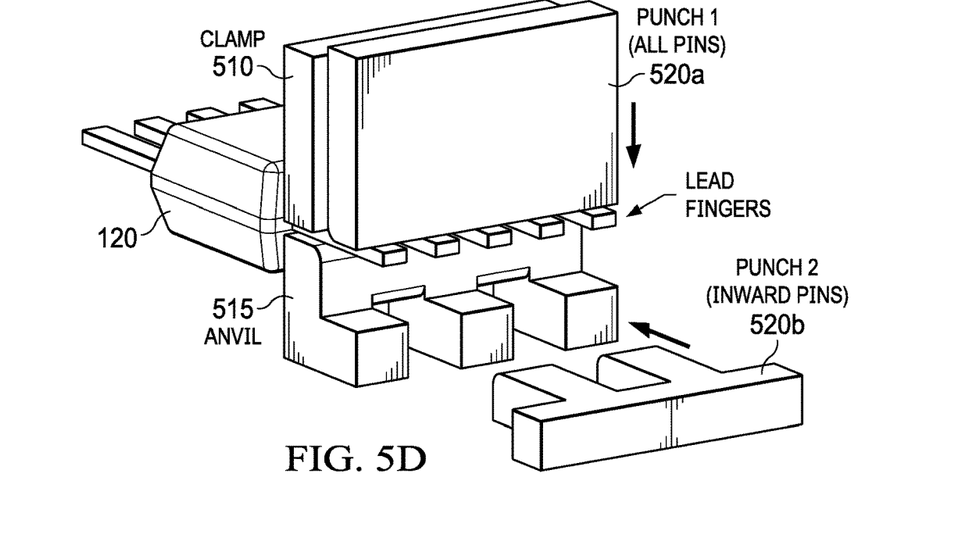

The anvil 515 is thus modified to contact alternating pins (even and odd), one anvil portion 515a configured to process the odd leads for providing a gull wing shape (two 90 degree curves), and another anvil portion set 515b configured to provide only one essentially 90 degree curve. The even leads include a second bending step to bend them inwards towards the housing 120. In the second bending step shown in FIG. 5C, punch 2 520b is directed to bend the end of the even leads in the horizontal (xy) plane inward toward the housing 120. FIG. 5D shows another view of example lead bending apparatus that has two punches, punch 1 520a applied to all leads and punch 2 520b applied to only the leads intended to be inward bent leads. Although the anvil is shown as 515, as described above the anvil 515 is modified between contacting the alternating odd pins shown as anvil 515a and even pins shown as anvil 515b, and the direction the punch 1 520a is moved as shown both being downward in the vertical direction.

Disclosed leadframe lead bending can be applied to a variety of leadframe types including stamped and etched lead frames, roughened and smooth lead frames, and lead frames with or without coating/plating. There are generally no needed changes to packaging and shipping media or process (same tubes, tape/reel, etc.).

Disclosed aspects can be integrated into a variety of assembly flows to form a variety of different semiconductor IC devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

EXAMPLES

Disclosed aspects are further illustrated by the following specific Examples, which should not be construed as limiting the scope or content of this Disclosure in any way.

Figure 6A:
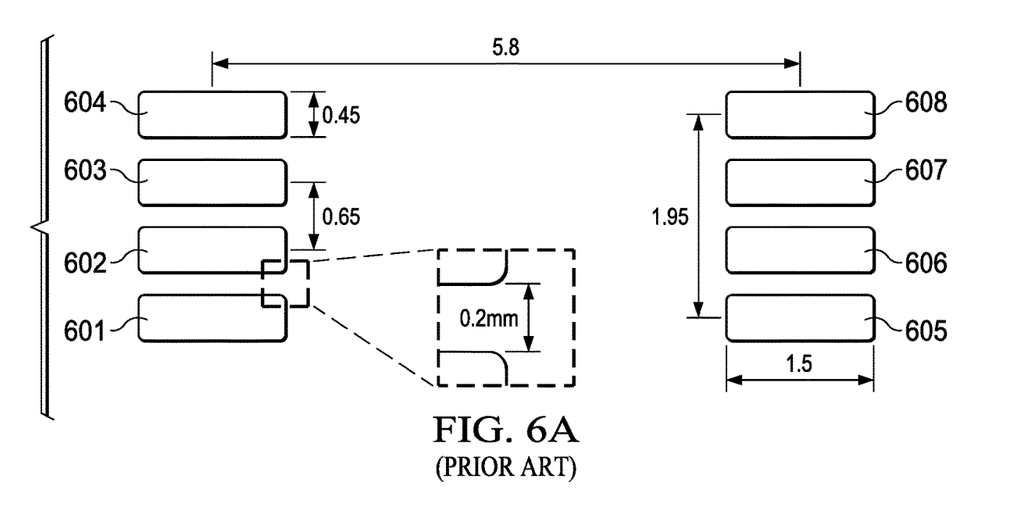
Figure 6B:
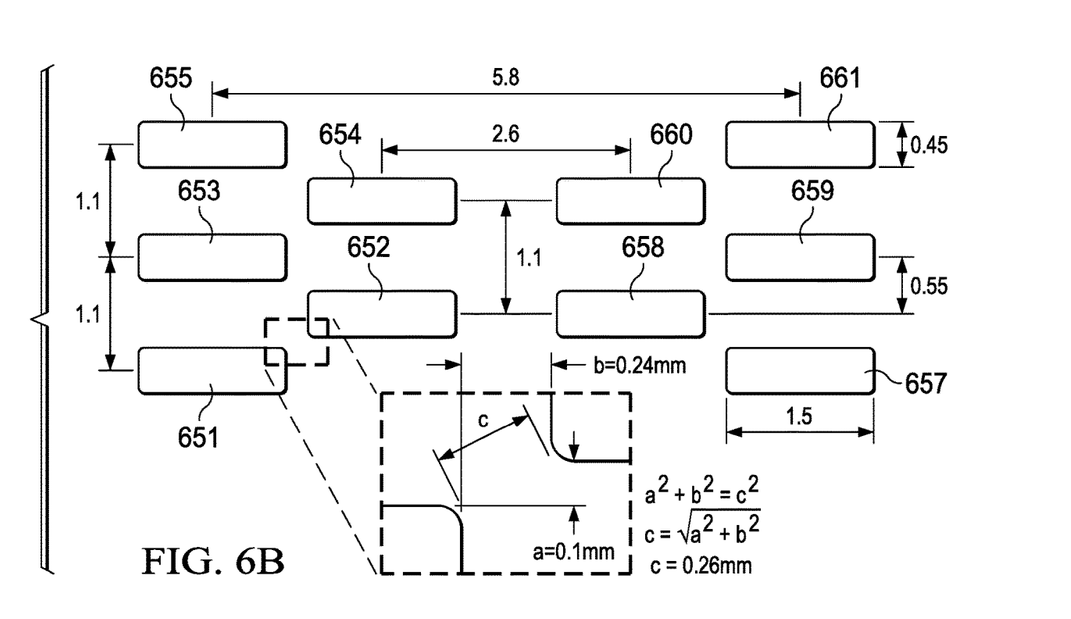
FIG. 6B shows the footprint for land pads of another PCB with staggered land pads for mounting leads of a disclosed 10-pin TSSOP package having alternating leads being inward bent leads that demonstrates one can increase lead spacing while increasing the lead count.

FIG. 6A shows a footprint for land pads 601-608 of a PCB configured with in-line land pads with some example spacing distances shown for mounting leads of a conventional 8-pin TSSOP package. FIG. 6B shows the footprint for land pads 651-655 and 657-661 of another PCB configured with staggered land pads for mounting leads of a disclosed 10-pin TSSOP package having alternating leads being inward bent leads that demonstrates one can increase the lead spacing while increasing the lead count. As described above the inner land pads can be shorted together to enhance the thermal or electrical performance. The land pads on the PCB are generally further routed to make contacts with other components on the PCB.

Figure 6C:
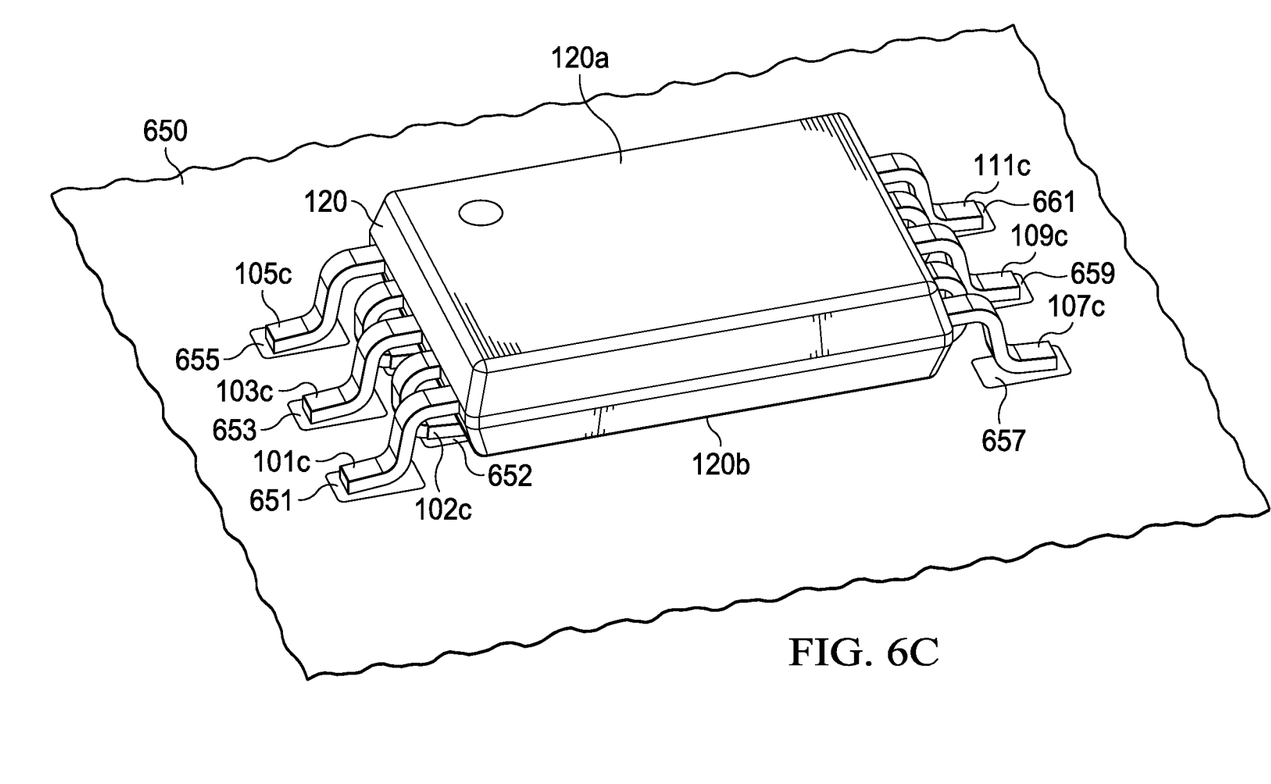
FIG. 6C shows the disclosed IC package shown in FIGS. 2A-D having alternating inward bent leads mounted onto the land pads that are in a staggered configuration on the PCB shown in FIG. 6B.

The PCB can be in a variety of configurations including multi-layered, flexible or rigid, ceramic, or metal cladded. A solder or other electrically conductive attach material (e.g., solder) typically electrically and mechanically connects the leads of the package to the land pads of the PCB. It is shown that by using disclosed leadframes that includes gull wing leads alternating with inward bent leads one can increase the lead spacing from 0.20 mm to 0.24 mm while also increasing package lead count from 8 pins to 10 pins. FIG. 6C shows the disclosed IC package shown in FIGS. 2A-D having alternating inward bent leads mounted onto the land pads 651-655 and 657-661 of a PCB 650 that are in the staggered configuration that is shown in FIG. 6B.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A packaged semiconductor device, comprising:
a semiconductor die having top side bond pads mounted on a leadframe;
a housing for the semiconductor die with a bottom surface and a top surface defining a horizontal plane and a horizontal direction, including a first sidewall and at least a second sidewall opposite the first sidewall between the bottom surface and the top surface;
wherein the leadframe comprises:
a plurality of leads each having an inner lead portion inside the housing and an outer lead portion that includes a first portion that extends out in the horizontal direction from one of the first and the second sidewalls, a transition portion that includes a vertical direction component, and a distal end portion, wherein the distal end portion of the plurality of leads are all on the horizontal plane; and
wherein the outer lead portions alternate between a gull wing lead shape having the distal end portions extending in the horizontal direction outward from the housing and inward extending leads that have the distal end portions extending in the horizontal direction inward toward the housing and completely below the bottom surface.

2. The packaged semiconductor device of claim 1, wherein at least one of the distal end portions of the inward extending leads are connected together on each side of the housing.

3. The packaged semiconductor device of claim 1, wherein the distal end portions extend over at least a portion of the bottom surface.

4. The packaged semiconductor device of claim 1, wherein the semiconductor die is mounted on the plurality of leads in a flipchip on lead (FCOL) configuration.

5. The packaged semiconductor device of claim 1, wherein the housing comprises a molded housing.

6. The packaged semiconductor device of claim 1, wherein the bond pads of the semiconductor die are flipchip attached to the inner lead portions.

7. The packaged semiconductor device of claim 1, wherein the leadframe further comprises a die pad, and wherein the semiconductor die is mounted with its top side up on the die pad, further comprising bond wires between the bond pads and the inner lead portions.

8. The packaged semiconductor device of claim 1, wherein the inward extending leads are C-shaped or J-shaped.

9. The packaged semiconductor device of claim 1, wherein a bottom surface of the distal end portion are all within a fixed distance ±0.1 mm measured from the bottom surface of the housing.

10. A leadframe configured for a packaged semiconductor device including a semiconductor die that includes a housing having a first sidewall and at least a second sidewall opposite the first sidewall with at least one semiconductor die having top side bond pads therein, comprising:
  a plurality of leads each having an inner lead portion inside the housing and an outer lead portion that includes a first portion that extends out in a horizontal direction from one of the first and the second sidewalls, a transition portion that includes a vertical direction component, and a distal end portion, wherein the distal end portion of the plurality of leads are all on a horizontal plane; and
  wherein the outer lead portions alternate between a gull wing lead shape having the distal end portions extending in the horizontal direction outward from the housing and inward extending leads that have the distal end portions extending in the horizontal direction inward toward the housing and completely below the bottom surface.

11. The leadframe of claim 10, wherein at least one of the distal end portions of the inward extending leads are connected together on each side of the housing.

12. The leadframe of claim 10, wherein the distal end portions extend under the housing.

13. The leadframe of claim 10, wherein the bond pads of the semiconductor die are flipchip attached to the inner lead portions.

14. The leadframe of claim 10, wherein the leadframe further comprises a die pad, and wherein the semiconductor die is mounted with its top side up on the die pad, further comprising bond wires between the bond pads and the inner lead portions.

15. The leadframe of claim 10, wherein the inward extending leads are C-shaped or J-shaped.

16. The leadframe of claim 10, wherein a bottom surface of the distal end portion are all within a fixed distance ±0.1 mm measured from the bottom surface of the housing.

17. A packaged semiconductor device, comprising:
  a semiconductor die having top side bond pads mounted on a leadframe having a plurality of leads each having an inner lead portion inside a housing for the semiconductor die with a bottom surface and a top surface defining a horizontal plane and a horizontal direction, including a first sidewall and at least a second sidewall opposite the first sidewall between the bottom surface and the top surface;
  distal lead portions of the plurality of leads to alternately form a gull wing lead shape and an inward extending lead that has a distal end bent inward toward the housing and completely below the bottom surface; and
  wherein a distal end portion of the plurality of leads are all on the horizontal plane.

18. The packaged semiconductor device of claim 17, wherein the inward extending leads are C-shaped.

19. The packaged semiconductor device of claim 17, wherein the inward extending leads are J-shaped.

20. The packaged semiconductor device of claim 17, further comprising the plurality of leads connected to land pads of a printed circuit board (PCB) that are in a staggered configuration.

* * * * *